United States Patent
Culliton et al.

(10) Patent No.: US 7,005,942 B2
(45) Date of Patent: Feb. 28, 2006

(54) NON-SWITCHING ADAPTABLE 4-WAY POWER SPLITTER/COMBINER

(75) Inventors: Brian E. Culliton, Dewitt, NY (US); Chong Mei, Syracuse, NY (US)

(73) Assignee: Anaren, Inc., East Syracuse, NY (US)

( * ) Notice: Subject to any disclaimer, the term of this patent is extended or adjusted under 35 U.S.C. 154(b) by 31 days.

(21) Appl. No.: 10/719,817

(22) Filed: Nov. 21, 2003

(65) Prior Publication Data
US 2005/0110594 A1    May 26, 2005

(51) Int. Cl.
*H01P 1/10*    (2006.01)

(52) U.S. Cl. .................. 333/125; 333/127; 333/104

(58) Field of Classification Search ............. 333/104, 333/100, 125, 127
See application file for complete search history.

(56) References Cited

U.S. PATENT DOCUMENTS

| | | | |
|---|---|---|---|
| 4,311,965 A * | 1/1982 | Jones ................... 330/124 R |
| 4,315,222 A | 2/1982 | Saleh | |
| 4,439,740 A * | 3/1984 | Harrington ............ 330/124 R |
| 4,439,744 A * | 3/1984 | Kumar et al. ............. 330/285 |
| 4,893,093 A * | 1/1990 | Cronauer et al. ........... 330/295 |
| 5,126,704 A * | 6/1992 | Dittmer et al. ............ 333/125 |
| 5,264,810 A * | 11/1993 | Sager et al. ................ 333/131 |
| 5,285,175 A * | 2/1994 | Edwards .................... 333/109 |
| 5,313,174 A * | 5/1994 | Edwards .................... 333/109 |
| 5,543,751 A | 8/1996 | Stedman et al. | |
| 5,767,755 A | 6/1998 | Kim | |
| 6,097,266 A * | 8/2000 | Nardozza et al. .......... 333/101 |
| 6,130,585 A * | 10/2000 | Whybrew et al. ............ 333/1 |
| 6,323,742 B1 * | 11/2001 | Ke ........................... 333/127 |
| 6,744,312 B1 * | 6/2004 | White et al. ................. 330/51 |

FOREIGN PATENT DOCUMENTS

EP    0 540 286 B1    10/1992

* cited by examiner

*Primary Examiner*—Robert Pascal
*Assistant Examiner*—Kimberly E Glenn
(74) *Attorney, Agent, or Firm*—Robert J. Sinnema; Bond, Schoeneck & King PLLC

(57) ABSTRACT

A 4-way power splitter/combiner circuit providing a plurality of transmission lines of selected impedance and phase shift to define four amplifier ports into which one to four amplifiers may be populated without reconfiguration of the circuit. The circuit provides acceptable VSWR and return loss under each operating condition.

19 Claims, 5 Drawing Sheets

NON-SWITCHING ADAPTABLE 4-WAY POWER SPLITTER/COMBINER

FIELD OF THE INVENTION

The present invention relates to combining and splitting high power, high frequency RF signals and, more particularly, to a device that splits such signals to provide inputs for 1 to 4 amplifiers and then combines the output signals from the individual amplifiers to produce a single amplified output.

BACKGROUND

Modern RF circuits often require amplified signals that are produced by splitting an input signal, providing it to a number of amplifier modules and then combining the output of the amplifier modules into a single amplified output signal. Often it would be beneficial to employ a circuit in which the number of amplifier modules can be increased or decreased as conditions demand. This allows initial construction of an operative amplifier circuit with a single amplifier module and subsequent addition of one to three amplifier modules to the circuit as technical needs require additional amplification or as financial constraints allow investment in additional amplifier modules.

Conventionally, power splitting and power combining in RF circuits is performed using Wilkinson type power divider/combiner systems, as generally described in "An N-Way Hybrid Power Divider" by E. J. Wilkinson, *IRE Transactions on Microwave Theory and Techniques*, Vol. MTT-8, No. 1, January 1960, at pp. 116–118. A deficiency of pure Wilkinson type systems is that they operate efficiently only when all of the branches of the divider/combiner include a properly operating amplifier module. If an amplifier module is missing or inoperative, the Wilkinson type divider or combiner loses efficiency because of the impedance mismatch presented by the inoperative/absent amplifier module.

As a result, there have been a variety of attempts to modify Wilkinson type divider combiners to overcome the difficulties presented by inoperative amplifiers. One such attempt is described in U.S. Pat. No. 5,543,751 to Stedman. Through the use of phasing lines and matching lines, each having a specific length and impedance, the Stedman power combiner is capable of acceptable efficiency if one or more of the installed amplifiers should fail. That is, the power loss if 1, 2 or 3 of the installed amplifiers fails (in a four-amplifier system), does not exceed 11% of the input power. In addition, to operate properly the Stedman device requires that all amplifier positions be populated with an amplifier.

Another attempt to solve the difficulty of inoperative amplifiers is described in U.S. Pat. No. 5,767,755 to Kim. Again, through the use of phasing lines and matching lines, each having a specific length and impedance, the Kim power combiner is capable of operating at acceptable efficiency levels even if one or more of its amplifiers fail. That is, the power loss if 1, 2 or 3 of the installed amplifiers fails, does not exceed 11% of the input power. To operate properly, the Kim device requires that all amplifier positions be populated with an amplifier.

A more complicated method of addressing the difficulty posed by inoperative amplifiers is described in U.S. Pat. No. 4,315,222 to Saleh. The power combiner disclosed in Saleh requires switches and sensing means to maximize performance of the network in case one of the amplifiers fails. When a failed amplifier is sensed, the switches alter the presented impedance to maintain an acceptable level of efficiency. The switches and sensing means of that network increase its complexity and cost.

The power combiner/splitter networks disclosed in Stedman, Kim and Saleh are designed to operate with a specific number of amplifier modules, and further, to provide acceptable levels of signal loss in the case that one or more of the amplifier modules should fail. Furthermore, each is designed to operate properly only when all available amplifier positions are populated with an amplifier. They are not designed to allow population of less than all amplifier positions or to permit subsequent addition of one or more amplifiers.

European Patent EP 0540286B1 to Japan Radio Co., Ltd. discloses a power divider combiner that will operate even when less than all of the amplifier positions is populated. The circuit disclosed in EP 0540286B1, however, must be designed to maximize performance when a selected number of amplifier modules is populated. When more or fewer amplifier positions are populated, performance of the circuit suffers. For example, if the circuit is designed as a four-way circuit that is maximized for performance when three amplifier positions are populated, the return loss when 1, 2 or 4 amplifier positions are populated will be higher than when 3 positions are populated.

What is needed is a four-way power splitter and combiner network that is capable of operating at acceptable efficiency when populated with one, two, three or four amplifier modules and that further provides acceptable signal attenuation and Voltage Standing Wave Ratio ("VSWR") if the network is populated with less than four amplifier modules.

SUMMARY

The present invention is suitable for splitting an input signal into one to four transmission paths, which are then amplified by one to four amplifier modules that are installed or removed in a particular order. After amplification, the present invention combines the signals into a single, in-phase amplified signal. For example, if the circuit is configured as a "back plane" with four amplifier ports and one of those ports is populated, then the populated port is port 1 or 2 and all unused ports are open-circuited at the unused amplifier ports If the amplifier is installed in port 1, a second amplifier can be added by simply installing it in port 2. A third and fourth amplifier can be installed in ports 3 and 4. It is not necessary to reconfigure the circuit to produce acceptable levels of return loss for each operating condition (i.e., 1, 2, 3 or 4 amplifier modules installed).

BRIEF DESCRIPTION OF THE DRAWINGS

The present invention will be more fully understood and appreciated by reading the following Detailed Description in conjunction with the accompanying drawings, in which.

DETAILED DESCRIPTION

Figure 1:
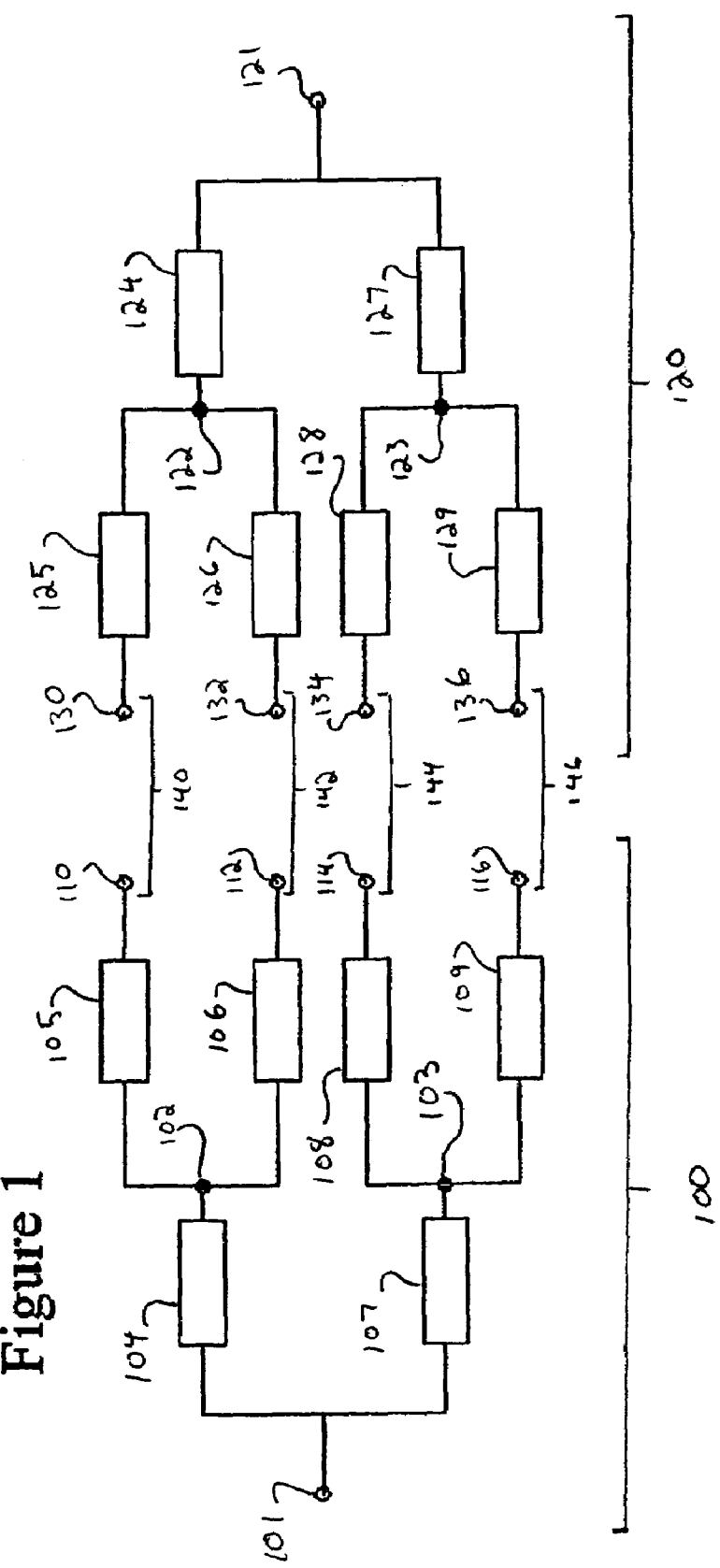
FIG. 1 is a schematic of an embodiment of the present invention.

Referring now to FIG. 1, there is seen a splitter/combiner 10 according to the present invention, comprising a splitter portion 100 and a combiner portion 120. The splitter portion 100 comprises an input port 101, two nodes 102, 103, a plurality of transmission lines 104, 105, 106, 107, 108, 109, and four amplifier inputs 110, 112, 114, 116. The combiner portion 120 comprises an output port 121, two nodes 122, 123, a plurality of transmission lines 124, 125, 126, 127, 128, 129, and four amplifier outputs 130, 132, 134, 136. The elements of the combiner portion 120 mirror corresponding elements of the splitter portion 100, except for the phase shift produced by the transmission lines 104–109, 124–129, as will be further described hereinbelow. More specifically, each amplifier input 110, 112, 114, 116 corresponds to an amplifier output 130, 132, 134, 136 and each pair of corresponding amplifier inputs and outputs (e.g., amplifier input 110 and amplifier output 130) defines an amplifier port 140, 142, 144, 146. Each amplifier port 140, 142, 144, 146 can accept an amplifier module 150 (see FIG. 4).

In operation, each amplifier port is either populated with an operating amplifier module or is left open. An open amplifier port can either be an amplifier port that is not populated with an amplifier module or one that is populated with an amplifier module that has been selectively switched to present an open circuit. As used herein, an inactive amplifier port means an amplifier port that presents an open circuit, either because it is not populated with an amplifier module or because it is populated with an amplifier module that has been selectively switched to present an open circuit. Because inactive amplifier ports present an open circuit, the length of each transmission line 104–109, 124–129 must be carefully selected to present the correct impedance in each operating condition (i.e., when 1, 2, 3 or 4 amplifier modules is installed) and also to properly shift the phase of the signal in each branch of the circuit such that the signal is in phase at the output port 121. Those skilled in the art will recognize that out-of-phase signals and incorrect impedances will reduce the efficiency of the splitter/combiner network.

Figure 3:
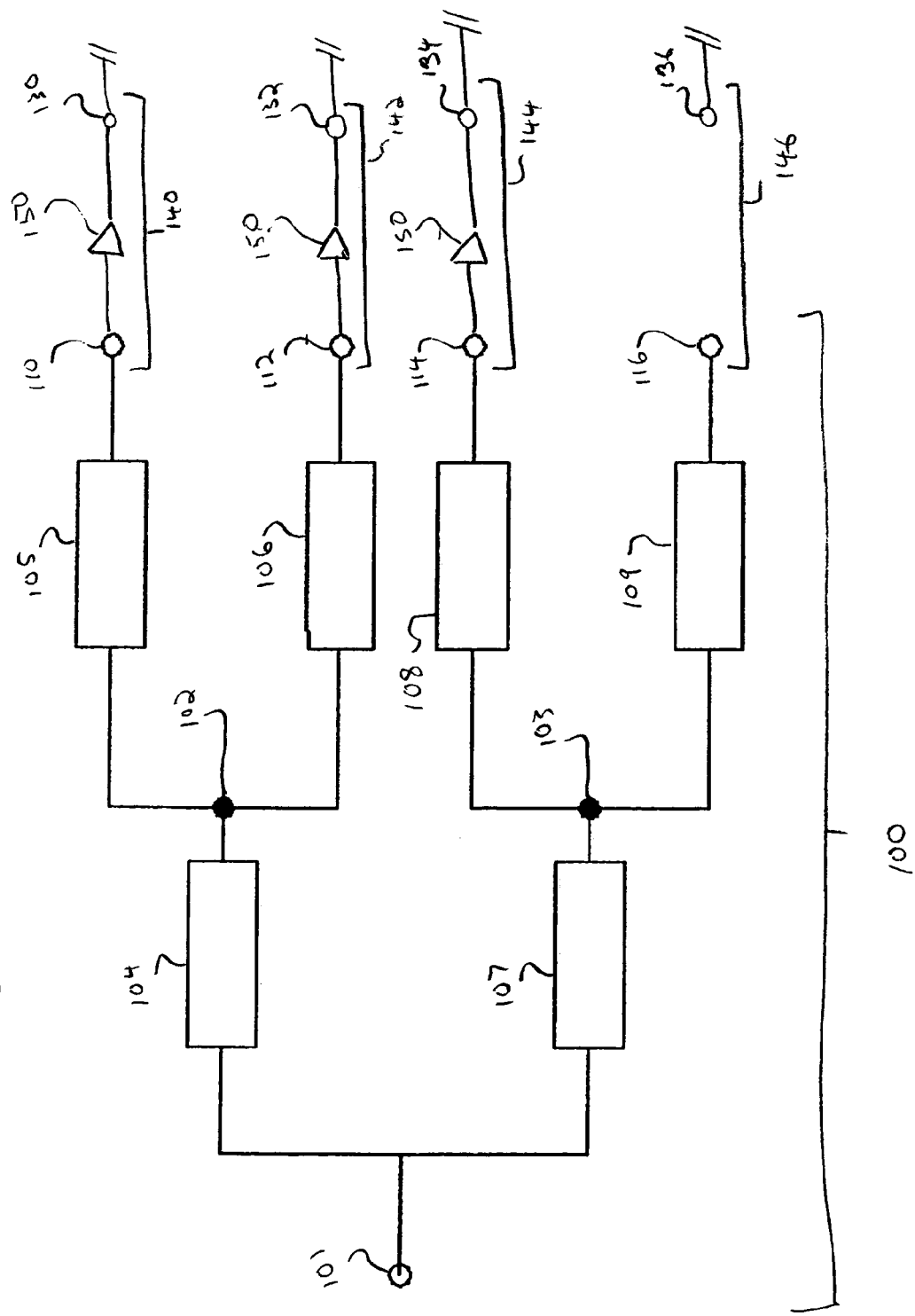
FIG. 3 is a schematic of another portion of an embodiment of the present invention.

Referring now to FIG. 3, there is depicted the splitter portion 100 and amplifier ports 140, 142, 144, 146 according to a first embodiment of the invention. For simplicity of description, the combiner portion 120 is not depicted. Those skilled in the art will recognize that the principles disclosed herein with respect to splitter portion 100, however, are equally applicable to the combiner portion 120. As will be further described hereinafter, however, the electrical lengths of elements in the combiner portion 120 are not the same as the lengths of counterpart components in the splitter portion 100. The input port 101 functions as a two-way junction, as do each of the nodes 102 and 103.

All amplifier ports 140, 142, 144, 146 are assumed to be 50-ohms when populated with an amplifier module 150. Referring again to FIG. 1, the length and impedance of each transmission line 104–109 and 124–129 is selected so that when only one branch of any of the junctions (i.e., input port 101, output port 121, nodes 102, 103, 122, 123) contains an active amplifier port, the energy from the active amplifier port(s) reflects off the open port(s) and is seen as an open circuit at the nearest junction, provided that the amplifier ports 140, 142, 144, 146 have been populated in sequence as disclosed herein.

According to the present invention, if the splitter/combiner 10 is populated with less than four amplifier modules 150, the amplifier ports 140, 142, 144, 146 are populated in a predetermined sequence. For example, if the splitter/combiner 10 is populated with only one amplifier module 150, that amplifier module 150 should populate first amplifier port 140 or second amplifier port 142. If the splitter/combiner 10 is populated with two amplifier modules, those amplifier modules 150 should populate first amplifier port 140 and second amplifier port 142. If the splitter/combiner 10 is populated with three amplifier modules 150, those amplifier modules 150 should populate first amplifier port 140, second amplifier port 142, and one of either third amplifier port 144 or fourth amplifier port 146.

Each possible path from the input port 101 through amplifier modules 150 and to output port 121 must have the same electrical length. That is, the phase change from the input port 101 to the output port 121 must be equal through each of the possible paths through which a signal can travel. The difference in electrical length from the input port 101 to first node 102 and from the input port 101 to second node 103 is 90 degrees. The difference in electrical length from the output port 121 to third node 122 and output port 121 to fourth node 123 is also 90 degrees. The signal produced at the output port 121 must be completely in phase. That is, if the input port 101 to first node 102 signal is +90 relative to the input port 101 to second node 103 signal, then the output port 121 to third node 122 signal must be −90 relative to the output port 121 to fourth node 123 signal. The relationship may also be reversed such that the input port 101 to first node 102 signal is −90 relative to the input port 101 to second node 103 signal and the output port 121 to third node 122 signal is +90 relative to the output port 121 to fourth node 123 signal.

Figure 2:
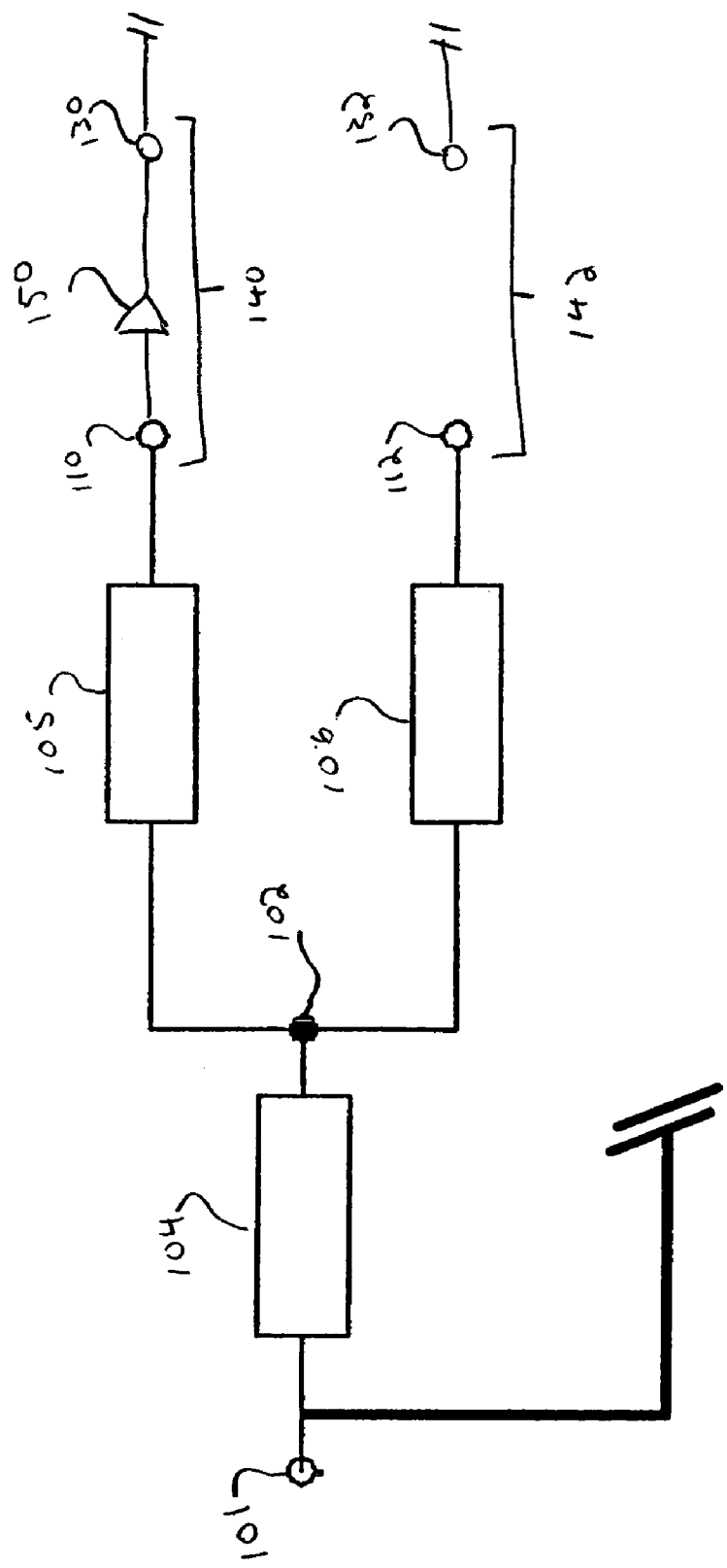
FIG. 2 is a schematic of a portion of an embodiment of the present invention.

Referring now to FIG. 2, there is depicted a part of the splitter portion 100, comprising input port 101, transmission lines 104, 105, 106, first node 102, first amplifier input 110 and second amplifier input 112. In addition, first amplifier output 130 and second amplifier output 132 are depicted, which with first amplifier input 110 and second amplifier input 112, respectively, define first amplifier port 140 and second amplifier port 142. Those skilled in the art will recognize that the structure of the splitter portion 100 is mirrored by the structure of the combiner portion 120 (see FIGS. 1, 4), except for the phase shift produced by the transmission lines 104–109, 124–129, as will be further described hereinbelow. As disclosed above, where only one amplifier port 140, 142, 144, 146 is populated it must be either first amplifier port 140 or second amplifier port 142. The other of these two amplifier ports 140, 142 will be inactive. For purposes of example only, FIG. 2 depicts an amplifier 150 populating first amplifier port 140. In this example, second amplifier port 142 is inactive. The length of transmission lines 105 and 107 must be selected such that the standing wave produced in transmission line 107 from first node 102 to the inactive amplifier port 142 must appear open circuited at first node 102. The impedance at the input port 101 will be 35.35 ohms, or some other reasonable impedance less than 50 ohms, transformed from 50 ohms at the active amplifier port (which in this example is first amplifier port 140).

In similar fashion, the length of transmission lines 108, 109 (see FIG. 3) must be selected such that when only one of amplifier ports 144 and 146 is populated, the standing wave produced in the transmission line between second node 103 and the inactive amplifier port appears open circuited at second node 103.

Referring now to FIG. 3, there is depicted the splitter portion 100, comprising input port 101, transmission lines 104–109, first node 102, second node 103, first amplifier input 110, second amplifier input 112, third amplifier input 114 and fourth amplifier input 116. Also depicted are first amplifier output 130, second amplifier output 132, third amplifier output 134 and fourth amplifier output 136, which with first amplifier input 110, second amplifier input 112, third amplifier input 114 and fourth amplifier input 116, respectively define first amplifier port 140, second amplifier port 142, third amplifier port 144 and fourth amplifier port 146. As described above, where only three amplifier ports are active, the active amplifier ports must be first amplifier port 140, second amplifier port 142, and one of either third amplifier port 144 or fourth amplifier port 146. For example purposes, FIG. 3 further depicts amplifier modules 150 populated in first amplifier port 140, second amplifier port 142 and third amplifier port 144. The standing wave produced in the transmission line from second node 103 to the inactive port (which in this example is fourth amplifier port 146) must appear open circuited at second node 103. The impedance at the input port 101 is 47.2 ohms, or some other impedance such that amplitude balance and return loss are reasonable. The impedance at the input port 101 is the result of the parallel combination of the impedance looking back into the path from third amplifier port 144 and fourth amplifier port 146, and the impedance looking back into the path from first amplifier port 140 and second amplifier port 142.

Figure 4:
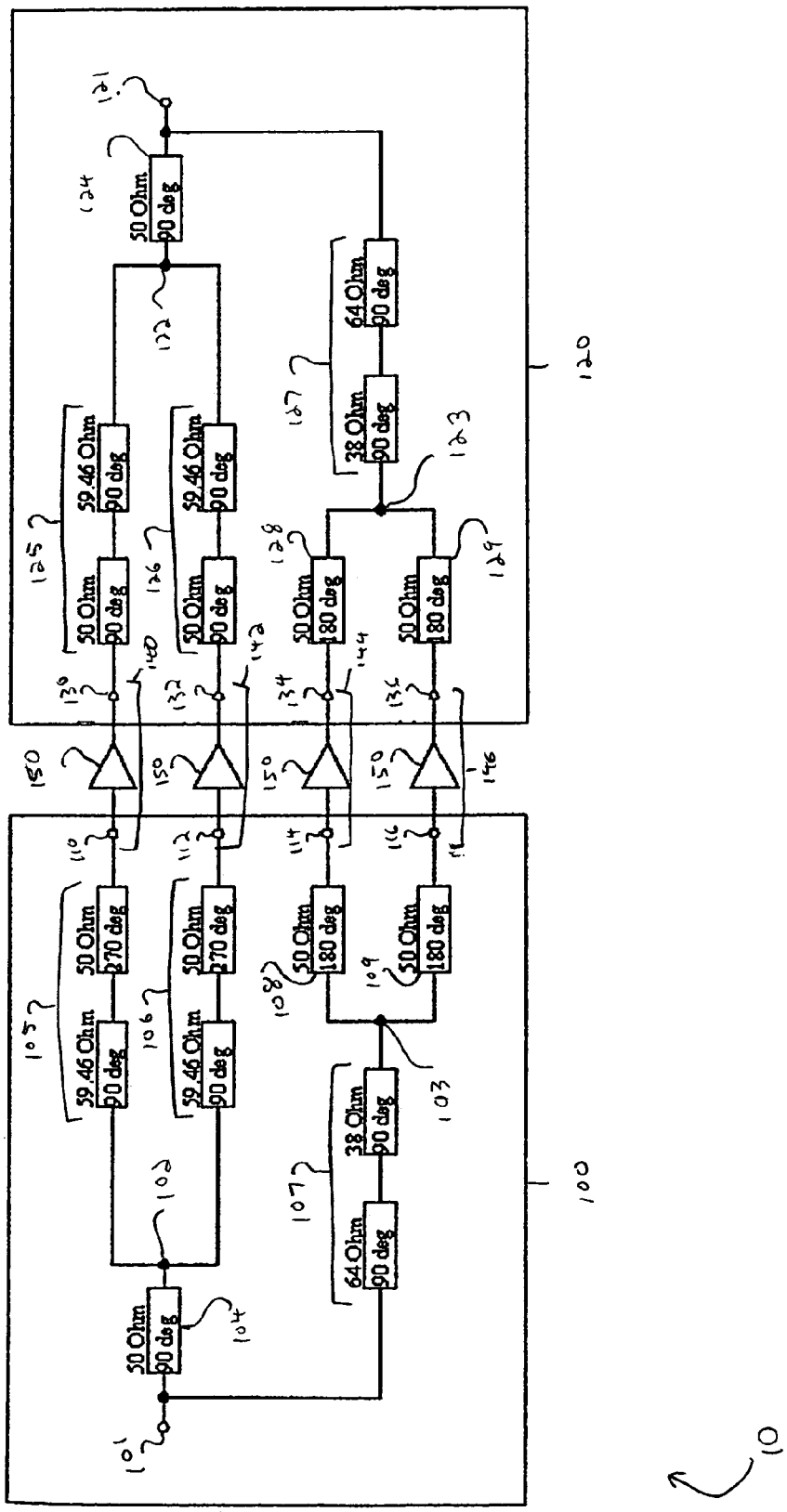
FIG. 4 is a schematic of the preferred embodiment of the present invention.

Referring now to FIG. 4, a splitter/combiner according to the preferred embodiment is depicted along with amplifier modules 150 populating the amplifier ports 140, 142, 144, 146. In the preferred embodiment the impedance transform from first amplifier port 140 to first node 102 comprises transmission line 105 and the impedance transform from second amplifier port 142 to first node 102 comprises transmission line 106, each of transmission lines 105, 106 comprising a segment having 50-ohms impedance and 270 degrees electrical length, and a segment having a 90-degree electrical length and an impedance of 59.46 ohms. The transmission lines 105, 106 must comprise one segment that is 90 degrees in length and a segment that is either 90 degrees in length or an odd multiple of 90 degrees. The impedance transform from first node 102 to the input port 101 comprises a transmission line 104 that is 90 degrees in length and has an impedance of 50 ohms.

The impedance transform through the segment of transmission lines 105 and 106 having impedance of 59.46-ohms is 50-ohms to 70.7-ohms seen at first node 102. The value of 70.7-ohms is selected because it is the geometric mean of the output impedances of a splitter/combiner 10 according to the present invention in which one amplifier port is active (50-ohms) and one in which two amplifier ports are active (100-ohms). The segment of transmission lines 105, 106 having impedance of 50-ohms must have a length selected so that the total electrical length from first amplifier port 140, through first node 102 to second amplifier port 142 is 360 degrees or a multiple of 360 degrees so that when one of amplifier ports 140, 142 is open the energy from the active amplifier port reflects off the open amplifier port and is seen as an open at first node 102. This open in parallel with the 70.7-ohm impedance at first node 102 will result in 70.7-ohm impedance. Therefore, in the case of one active amplifier port, the impedance at first node 102 is 70.7-ohms. The impedance is then transformed to 35.35-ohms through transmission line 104, which has an impedance of 50 ohms and an electrical length of 90 degrees, to the input port 101. VSWR is 1.42:1 or 15.22 dB return loss, with loss due to mismatch equal to 0.13 dB.

In both the splitter and combiner where only two amplifier ports are active, the impedance at the input port 101 will be 70.7-ohms, or some other reasonable impedance greater than 50 ohms, transformed from the lower impedance of the parallel combination at first node 102.

In the case of two active amplifier ports (first amplifier port 140 and second amplifier port 142), first node 102 results in the parallel combination of the two active amplifier ports which are 70.7-ohms each which equals 35.35-ohms. When transformed through transmission line 104, the result is 70.7-ohms at the input port 101. VSWR is 1.42:1 or 15.22 dB return loss, with loss due to mismatch equal to 0.13 dB.

The impedance transform from third amplifier port 144 to second node 103 comprises a transmission line 108 of 50 ohms impedance and the impedance transform from fourth amplifier port 146 to second node 103 comprises a transmission line 109 of 50 ohms impedance. Transmission line 108 and transmission line 109 each have a length of 180 degrees or any other even multiple of 90 degrees. From second node 103 to the input point 100 comprises a transmission line 107 having a segment with electrical length of 90 degrees and an impedance of 38 ohms and another segment having an electrical length of 90 degrees and an impedance of 64 ohms.

In both the splitter and combiner when all four amplifier ports are active, the impedance at the input port 101 or output port 121 will be 70.7-ohms, or some other impedance such that amplitude balance and return loss are reasonable. The impedance at the input port 101 or output port 121 is the result of the parallel combination of the impedance looking back into the path from third amplifier port 144 and fourth amplifier port 146, and the impedance looking back into the path from first amplifier port 140 and second amplifier port 142.

The impedance transform through transmission line 107 to the input port 101 is either 50-ohms to 142-ohms when one of amplifier ports 144 and 146 is active, or 25-ohms to 70.7-ohms when both amplifier ports 144 and 146 are active. The 50-ohm transmission line from third amplifier port 144 and fourth amplifier port 146 must be such that when one of these amplifier ports is open the energy from the active amplifier port reflects off the open amplifier port and is seen as an open at second node 103. This open in parallel with the 50-ohm impedance at second node 103 will result in 50-ohm impedance. Therefore, in the case of one of amplifier ports 144 and 146 being active, the impedance at second node 103 is 50-ohms. The impedance is then transformed to 142-ohms through transmission line 107 to the input port 101.

In the case both third amplifier port 144 and fourth amplifier port 146 are active, the impedance at second node 103 is the parallel combination of the impedances of the two active amplifier ports 144 and 146 at 50-ohms each, which equals 25-ohms. When transformed through transmission line 107, the result is 70.7-ohms at the input port 101.

When both third amplifier port 144 and fourth amplifier port 146 are open circuited, the reflection from either of those ports at the input port 101 must also be an open circuit. As discussed before, second node 103 must appear as an open when one of either amplifier port 144 or amplifier port 146 are active. Therefore, the impedance transform from second node 103 to the input port 101 is a transmission line 107 having a two-segment (180-degree) transformer, which appears open at the input port 101 when both third amplifier port 144 and fourth amplifier port 146 are open.

When first amplifier port 140, second amplifier port 142, and one of third amplifier port 142 or fourth amplifier port 146 are active, the input port 101 impedance is equal to the parallel combination of 70.7-ohms from first amplifier port 140 and second amplifier port 142, and 142-ohms from the active amplifier port of third amplifier port 144 or fourth amplifier port 146. The result is 47.2-ohms. VSWR is 1.062:1 or 30.39 dB return loss.

When all four amplifier ports are active, the impedance at the input port 101 is equal to the parallel combination of 70.7-ohms and 70.7-ohms. The result is 35.35-ohms. VSWR is 1.42:1 or 15.22 dB return loss, with loss due to mismatch equal to 0.13 dB. Table 1 shows a summary of the input port impedance, VSWR and return loss, with loss due to mismatch equal to 0.13 dB.

The purpose of the impedance transformation in transmission lines 104–109, 125–129 is to transform the impedance of amplifier modules 150, which is assumed to be 50Ω, to an acceptable impedance at input port 101 and output port 121. Generally, an acceptable impedance at input port 101 and output port 121 will be between approximately 35.35Ω and 70.7Ω. Those skilled in the art will recognize that the principles disclosed herein with respect to impedance selection for transmission lines 104–109 in the splitter portion 100 apply equally with respect to transmission lines 125–129 in the combiner portion 120. Moreover, those skilled in the art will recognize that impedance transformation equivalent to that produced by can be accomplished by transmission lines that have more segments than depicted in FIG. 4, provided that 1) the electrical length of each path through transmission lines 104–109, 125–129 satisfies the equations set forth below, and 2) the impedance of each segment is selected to produce impedance transformation for each of transmission lines 104–109, 125–129 that is generally equivalent to that depicted in FIG. 4.

Figure 5:
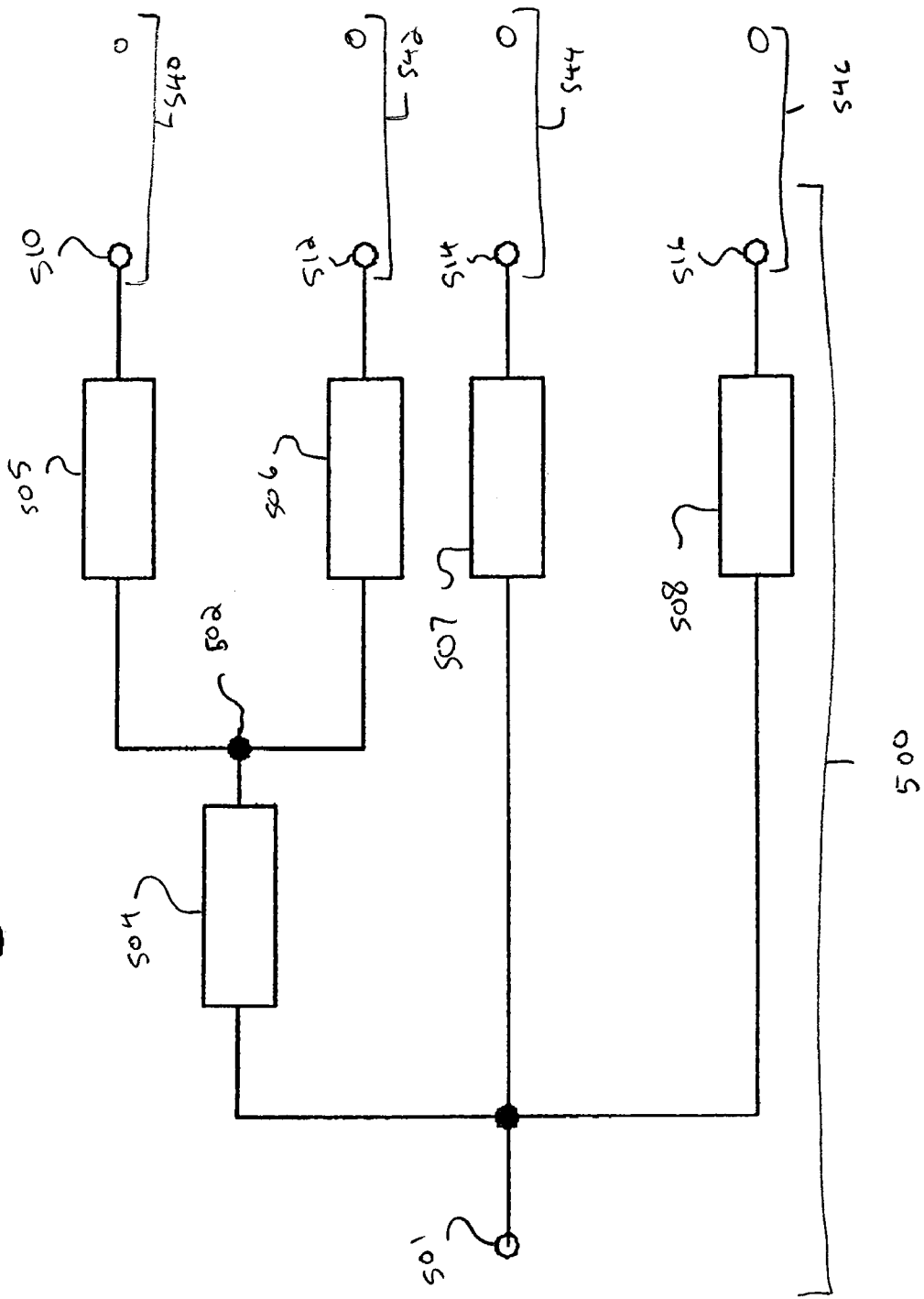
FIG. 5 is a schematic of a portion of an alternate embodiment of the present invention.

Referring now to FIG. 5, there is depicted an alternate embodiment, in which the splitter portion 500 has an input port 501 which functions as a three-way junction and one node 502, which functions as a two-way junction. The transmission lines from third amplifier port 544 and fourth amplifier port 546 can be joined directly to the input port 501. If the two transmission lines are routed directly to the input port 501, they must appear open to the input port 501 when they are not active. In this embodiment, when all four amplifier ports 540, 542, 544, 546 are active, the impedance transform will result in 35.35 ohms at the input port 501, or some other impedance such that amplitude balance and return loss are reasonable. As described below, the structure of the combiner portion 520 (not shown) according to this embodiment will mirror that of the splitter portion 500.

Table 1 shows a summary of the impedance (as viewed from input port 101 or output port 121, VSWR and return loss under the various conditions using the circuit depicted in FIG. 4 as an example.

TABLE 1

| Condition | Impedance | VSWR | Return Loss | Loss (%) |
|---|---|---|---|---|
| 1-Way | 35.35-ohms | 1.42:1 | 15.2 dB | 3 |
| 2-Way | 70.7-ohms | 1.42:1 | 15.2 dB | 3 |
| 3-Way | 47.2-ohms | 1.06:1 | 30.4 dB | 0 |
| 4-Way | 70.7-ohms | 1.42:1 | 15.2 dB | 3 |

As described herein, the splitter portion 100 generally mirrors the combiner portion 120. That is, each component of the splitter portion 100 is mirrored by a corresponding component in the combiner portion. For example, the input port 101 corresponds to the output port 121 and transmission line 109 corresponds to transmission line 129. In general, corresponding components have the same electrical characteristics. For example, in the preferred embodiment depicted at FIG. 4, transmission line 109 and transmission line 129 both have an impedance of 50 ohms and an electrical length of 180 degrees. This correspondence relationship does not hold true for the electrical length of transmission lines 105, 106, 125 and 126.

FIG. 4 shows the phase relationship between all the ports on both the splitter and combiner in the preferred embodiment. The impedances of transmission lines 105 and 106 are the same as the corresponding transmission lines 125 and 126. The electrical lengths of transmission lines 105 and 106, however, differ by 180 degrees from the electrical lengths of transmission lines 125 and 126. This is done so that all four paths from the input port 101 to the output port 121 have the same electrical length necessary for properly combining coherent signals. Neither the splitter portion 100 nor the combiner portion 120 are stand-alone circuits due to the phase relationships between the input port 101 and output port 121. The splitter portion 100 and the combiner portion 120 are designed to work together, as it is necessary to realign the phases after amplification.

According to the present invention, the relationship of the electrical lengths through each possible path of the splitter/combiner must satisfy the following equations, where Φ is the electrical length of a transmission line segment:

$$\Phi_{(transmission\ line\ 104)} + \Phi_{(transmission\ line\ 105)} = \Phi_{(transmission\ line\ 104)} + \Phi_{(transmission\ line\ 106)} = X$$

$$\Phi_{(transmission\ line\ 107)} + \Phi_{(transmission\ line\ 108)} = \Phi_{(transmission\ line\ 107)} + \Phi_{(transmission\ line\ 109)} = Y$$

$$\Phi_{(transmission\ line\ 124)} + \Phi_{(transmission\ line\ 125)} = \Phi_{(transmission\ line\ 124)} + \Phi_{(transmission\ line\ 126)} = X'$$

$$\Phi_{(transmission\ line\ 127)} + \Phi_{(transmission\ line\ 128)} = \Phi_{(transmission\ line\ 127)} + \Phi_{(transmission\ line\ 129)} = Y'$$

According to the present invention, the electrical length of the path from input port 101 through first node 102 to amplifier inputs 110, 112 differs from the electrical length of the path from input port 101 through second node 103 to amplifier inputs 114, 116. In addition, the electrical length of the path from output port 121 through third node 122 to amplifier outputs 130, 132 differs from the electrical length of the path from output port 121 through fourth node 123 to amplifier outputs 134, 136. The difference in each case is 90 degrees, or described using terms of the above equations, |X−Y|=90 and |X'−Y'|=90. Furthermore, the difference in the electrical length between the path through first node 102 and second node 103 is the opposite of the difference in electrical length between the path through third node 122 and fourth node 123. That is, (X−Y)=(Y'−X').

While there has been illustrated and described what is at present considered to be the preferred and other embodiments of the invention, it should be appreciated that changes and modifications are likely to occur to those skilled in the art. It is intended in the appended claims to cover all those changes and modifications that fall within the spirit and scope of the present invention.

What is claimed is:

1. A 4-way power splitter/combiner circuit for use with power amplifiers, comprising:
   a splitter circuit, further comprising
   an input port;
   a first node;
   a second node;
   a first splitter transmission line having an impedance $Z_{S1}$ and an electrical length $\Phi_{S1}$, said first splitter transmission line for connecting said input port to said first node;

a second splitter transmission line having an impedance $Z_{S2}$ and an electrical length $\Phi_{S2}$, said second splitter transmission line for connecting said input port to said second node;
a first amplifier input;
a second amplifier input;
a third amplifier input;
a fourth amplifier input;
a third splitter transmission line having an impedance $Z_{S3}$ and an electrical length $\Phi_{S3}$, said third splitter transmission line for connecting said first node to said first amplifier input;
a fourth splitter transmission line having an impedance $Z_{S4}$ and an electrical length $\Phi_{S4}$, said fourth splitter transmission line for connecting said first node to said second amplifier input;
a fifth splitter transmission line having an impedance $Z_{S5}$ and an electrical length $\Phi_{S5}$, said fifth splitter transmission line for connecting said second node to said third amplifier input;
a sixth splitter transmission line having an impedance $Z_{S6}$ and an electrical length $\Phi_{S6}$, said sixth splitter transmission line for connecting said second node to said fourth amplifier input;
a combiner circuit, further comprising
an output port;
a third node;
a fourth node;
a first combiner transmission line having an impedance $Z_{C1}$ and an electrical length $\Phi_{C1}$, said first combiner transmission line for connecting said output port to said third node;
a second combiner transmission line having an impedance $Z_{C2}$ and an electrical length $\Phi_{C2}$, said second combiner transmission line for connecting said output port to said fourth node;
a first amplifier output;
a second amplifier output;
a third amplifier output;
a fourth amplifier output;
a third combiner transmission line having an impedance $Z_{C3}$ and an electrical length $\Phi_{C3}$, said third combiner transmission line for connecting said third node to said first amplifier output;
a fourth combiner transmission line having an impedance $Z_{C4}$ and an electrical length $\Phi_{C4}$, said fourth combiner transmission line for connecting said third node to said second amplifier output;
a fifth combiner transmission line having an impedance $Z_{C5}$ and an electrical length $\Phi_{C5}$, said fifth combiner transmission line for connecting said fourth node to said third amplifier output;
a sixth combiner transmission line having an impedance $Z_{C6}$ and an electrical length $\Phi_{C6}$, said sixth combiner transmission line for connecting said fourth node to said fourth amplifier output;
wherein said first amplifier input and said first amplifier output together define a first amplifier port, said second amplifier input and said second amplifier output together define a second amplifier port, said third amplifier input and said third amplifier output together define a third amplifier port, and said fourth amplifier input and said fourth amplifier output together define a fourth amplifier port, each said amplifier port for receiving an amplifier;
wherein said first amplifier port, said second amplifier port, said third amplifier port and said fourth amplifier port collectively accept one to four amplifiers and the fraction of power provided to each of said amplifiers is 1/N where N is the number of operative amplifiers; and
wherein the phase shift of each of said combiner transmission lines and each of said splitter transmission lines is selected to produce an in-phase signal at said output port.

2. The 4-way power splitter/combiner circuit of claim 1 wherein the electrical lengths of said transmission lines satisfy the following equations:

$$\Phi_{S1}+\Phi_{S3}=\Phi_{S1}+\Phi_{S4}=X;$$

$$\Phi_{S2}+\Phi_{S5}=\Phi_{S2}+\Phi_{S6}=Y;$$

$$\Phi_{C1}+\Phi_{C3}=\Phi_{C1}+\Phi_{C4}=X';$$

$$\Phi_{C2}+\Phi_{C5}=\Phi_{C2}+\Phi_{C6}=Y';$$

$$|X-Y|=|X'-Y'|=90 \text{ degrees; and}$$

$$(X-Y)=(Y'-X').$$

3. The 4-way power splitter/combiner circuit of claim 1, further comprising at least one amplifier.

4. The 4-way power splitter/combiner circuit of claim 3 wherein the impedance presented by said input port and said output port are between approximately 35 Ω and approximately 71 Ω.

5. The 4-way power splitter/combiner circuit of claim 3 wherein said at least one amplifier comprises a first amplifier in said second amplifier port.

6. The 4-way power splitter/combiner circuit of claim 3 wherein said at least one amplifier comprises a first amplifier in said first amplifier port.

7. The 4-way power splitter/combiner circuit of claim 6 wherein said at least one amplifier further comprises a second amplifier in said second amplifier port.

8. The 4-way power splitter/combiner circuit of claim 7 wherein said at least one amplifier further comprises a third amplifier in said fourth amplifier port.

9. The 4-way power splitter/combiner circuit of claim 7 wherein said at least one amplifier further comprises a third amplifier in said third amplifier port.

10. The 4-way power splitter/combiner circuit of claim 9 wherein said at least one amplifier further comprises a fourth amplifier in said fourth amplifier port.

11. A 4-way power splitter/combiner circuit for use with power amplifiers, comprising:
an input port;
a first splitter transmission line connecting a first amplifier input to a first splitter node, said first splitter transmission line comprising a first splitter impedance transformer segment having impedance of 59.46 Ω and electrical length of 90° and a first splitter phase matching segment having impedance of 50 Ω and electrical length of 270°;
a second splitter transmission line connecting a second amplifier input to said first splitter node, said second splitter transmission line comprising a second splitter impedance transformer segment and a second splitter phase matching segment, each of said second splitter impedance transformer segment and said second splitter phase matching segment having impedance and electrical length substantially identical to that of said first splitter impedance transformer and said splitter first phase matching segment;

a third splitter transmission line connecting a third amplifier input to a second splitter node, said third splitter transmission line having impedance of 50 Ω and electrical length of 180°;

a fourth splitter transmission line connecting a fourth amplifier input to said second splitter node, said fourth splitter transmission line having impedance and electrical length substantially identical to that of said third splitter transmission line;

a fifth splitter transmission line connecting said second splitter node to said input port, said fifth splitter transmission line comprising a third splitter impedance transformer segment having impedance of 38 Ω and electrical length of 90°, and a fourth splitter impedance transformer segment having impedance of 64 Ω and electrical length of 90°;

a sixth splitter transmission line connecting said first splitter node to said input port, said sixth splitter transmission line having impedance of 50 Ω and electrical length of 90°;

an output port;

a first combiner transmission line connecting a first amplifier output to a first combiner node, said first combiner transmission line comprising a first combiner impedance transformer segment having impedance of 59.46 Ω and electrical length of 90° and a first combiner phase matching segment having impedance of 50 Ω and electrical length of 90°;

a second combiner transmission line connecting a second amplifier output to said first combiner node, said second combiner transmission line comprising a second combiner impedance transformer segment and a second combiner phase matching segment, each of said second combiner impedance transformer segment and said second combiner phase matching segment having impedance and electrical length substantially identical to that of said first combiner impedance transformer and said combiner first phase matching segment;

a third combiner transmission line connecting a third amplifier output to a second combiner node, said third combiner transmission line having impedance of 50 Ω and electrical length of 180°;

a fourth combiner transmission line connecting a fourth amplifier output to said second combiner node, said fourth combiner transmission line having impedance and electrical length substantially identical to that of said third combiner transmission line;

a fifth combiner transmission line connecting said second combiner node to said output port, said fifth combiner transmission line comprising a third combiner impedance transformer segment having impedance of 38 Ω and electrical length of 90°, and a fourth combiner impedance transformer segment having impedance of 64 Ω and electrical length of 90°;

a sixth combiner transmission line connecting said first combiner node to said output port, said sixth combiner transmission line having impedance of 50 Ω and electrical length of 90°;

wherein said first amplifier input and said first amplifier output together define a first amplifier port for receiving an amplifier, said second amplifier input and said second amplifier output together define a second amplifier port for receiving an amplifier, said third amplifier input and said third amplifier output together define a third amplifier port for receiving an amplifier, said fourth amplifier input and said fourth amplifier output together define a fourth amplifier port for receiving an amplifier; and wherein 1–4 power amplifiers may be inserted in said amplifier ports to provide an amplified signal.

12. A 4-way power splitter/combiner circuit for use with power amplifiers, comprising:

a splitter circuit, further comprising
an input port;
a first node;
a second node;
a first splitter transmission line for connecting said input port to said first node;
a second splitter transmission line for connecting said input port to said second node;
a first amplifier input;
a second amplifier input;
a third amplifier input;
a fourth amplifier input;
a third splitter transmission line for connecting said first node to said first amplifier input;
a fourth splitter transmission line for connecting said first node to said second amplifier input;
a fifth splitter transmission line for connecting said second node to said third amplifier input;
a sixth splitter transmission line for connecting said second node to said fourth amplifier input;

a combiner circuit, further comprising
an output port;
a third node;
a fourth node;
a first combiner transmission line for connecting said output port to said third node;
a second combiner transmission line for connecting said output port to said fourth node;
a first amplifier output;
a second amplifier output;
a third amplifier output;
a fourth amplifier output;
a third combiner transmission line for connecting said third node to said first amplifier output;
a fourth combiner transmission line for connecting said third node to said second amplifier output;
a fifth combiner transmission line for connecting said fourth node to said third amplifier output;
a sixth combiner transmission line for connecting said fourth node to said fourth amplifier output;

wherein said first amplifier input and said first amplifier output together define a first amplifier port, said second amplifier input and said second amplifier output together define a second amplifier port, said third amplifier input and said third amplifier output together define a third amplifier port, and said fourth amplifier input and said fourth amplifier output together define a fourth amplifier port, each said amplifier port for receiving an amplifier;

wherein said splitter/combiner circuit accepts one to four amplifiers and the fraction of power provided to each of said amplifiers is 1/N where N is the number of operative amplifiers; and wherein said splitter transmission lines and said combiner transmission lines have a plurality of electrical lengths; and wherein the electrical lengths of each of said combiner transmission lines and each of said splitter transmission lines are selected to produce an in-phase signal at said output port.

13. The 4-way power splitter/combiner circuit of claim 12 further comprising an amplifier.

14. The 4-way power splitter/combiner circuit of claim 13 wherein said amplifier is populated in said first amplifier port.

15. The 4-way power splitter/combiner circuit of claim 13 wherein said amplifier is populated in said second amplifier port.

16. A 4-way power splitter/combiner circuit for use with power amplifiers, comprising:

a splitter circuit, further comprising
   an input port;
   a splitter node;
   a first amplifier input;
   a second amplifier input;
   a third amplifier input;
   a fourth amplifier input;
   a first splitter transmission line having an impedance and an electrical length, said first splitter transmission line for connecting said input port to said splitter node;
   a second splitter transmission line having an impedance and an electrical length, said second splitter transmission line for connecting said splitter node to said first amplifier input;
   a third splitter transmission line having an impedance and an electrical length, said third splitter transmission line for connecting said splitter node to said second amplifier input;
   a fourth splitter transmission line having an impedance and an electrical length, said fourth splitter transmission line for connecting said input port to said third amplifier input;
   a fifth splitter transmission line having an impedance and an electrical length, said fifth splitter transmission line for connecting said input port to said fourth amplifier input;

a combiner circuit, further comprising
   an output port;
   a combiner node;
   a first amplifier output;
   a second amplifier output;
   a third amplifier output;
   a fourth amplifier output;
   a first combiner transmission line having an impedance and an electrical length, said first combiner transmission line for connecting said output port to said combiner node;
   a second combiner transmission line having an impedance and an electrical length, said second combiner transmission line for connecting said combiner node to said first amplifier output;
   a third combiner transmission line having an impedance and an electrical length, said third combiner transmission line for connecting said combiner node to said second amplifier output;
   a fourth combiner transmission line having an impedance and an electrical length, said fourth combiner transmission line for connecting said output port to said third amplifier output;
   a fifth combiner transmission line having an impedance and an electrical length, said fifth combiner transmission line for connecting said output port to said fourth amplifier output;

wherein said first amplifier input and said first amplifier output together define a first amplifier port, said second amplifier input and said second amplifier output together define a second amplifier port, said third amplifier input and said third amplifier output together define a third amplifier port, and said fourth amplifier input and said fourth amplifier output together define a fourth amplifier port, each said amplifier port for receiving an amplifier;

wherein said splitter/combiner circuit accepts one to four amplifiers and the fraction of power provided to each of said amplifiers is 1/N where N is the number of operative amplifiers; and wherein the electrical length of each of said combiner transmission lines and each of said splitter transmission lines is selected to produce an in-phase signal at said output port.

17. The 4-way power splitter/combiner circuit of claim 16 further comprising an amplifier.

18. The 4-way power splitter/combiner circuit of claim 17 wherein said amplifier is populated in said first amplifier port.

19. A splitter/combiner circuit comprising:

an N-way splitter circuit including a common input port coupled to N-amplifier input ports by way of at least one splitter impedance transformation network, the N-amplifier input ports being configured to accommodate at least one of N-RF amplifiers installed in the splitter/combiner circuit in a predetermined sequence, the at least one splitter impedance transformation network being characterized by at least one predetermined electric length and configured to provide each of the installed N-RF amplifiers with an RF amplifier input signal having an amplifier input signal power that is substantially equal to the signal power of a common input port signal divided by N, whereby N is an integer value between one (1) and four (4) inclusively; and an N-way combiner circuit including N-amplifier output ports coupled to a common output port by way of at least one combiner impedance transformation network, the N-amplifier output ports corresponding to the N-amplifier input ports and configured to accommodate the at least one N-RF amplifiers installed in the splitter/combiner circuit in the predetermined sequence, the at least one combiner impedance transformation network being characterized by the at least one predetermined electric length and configured as a schematic mirror image of the at least one splitter impedance transformation network.

* * * * *